United States Patent [19]
Abram et al.

[11] Patent Number: 6,072,412
[45] Date of Patent: Jun. 6, 2000

[54] PARALLEL PORT TO SERIAL DIGITAL FIBER LINK CONNECTOR

[75] Inventors: Philip Abram, Warwick, N.Y.; Peter Douma, Wyckoff, N.J.

[73] Assignees: Sony Corporation, Tokyo, Japan; Sony Electronics, Inc., Park Ridge, N.J.

[21] Appl. No.: 09/067,981

[22] Filed: Apr. 29, 1998

[51] Int. Cl.$^7$ ............................................. H03M 9/00
[52] U.S. Cl. ................................................... 341/100
[58] Field of Search ............................. 341/100, 101; 395/425

[56] References Cited

U.S. PATENT DOCUMENTS 5,157,775  10/1992  Sanger ........................................ 395/425

*Primary Examiner*—Brian Young
*Attorney, Agent, or Firm*—Ronald P. Kananen; Rader, Fishman & Grauer

[57] ABSTRACT

A parallel port to serial digital fiber link converter has a first high speed communications port connected to a first shift register for converting a serial digital signal, received from a first digital device via a first high speed communications link, to a parallel signal and transferring it to a personal computer via a parallel port. A second shift register and second high speed communications port are used for converting parallel data, retrieved via the parallel port of the personal computer, into serial digital data and sending it to a second digital device via a second high speed communications link for storage or playback.

20 Claims, 1 Drawing Sheet

PARALLEL PORT TO SERIAL DIGITAL FIBER LINK CONNECTOR

FIELD OF THE INVENTION

The present invention relates to parallel port connectors and, in particular, a parallel port for serial digital fiber optic link connectors which converts serial digital data to parallel digital data. The parallel port connector of the present invention comprises a first light emitting diode ("LED") for receiving serial digital data from a first digital device via a first high speed communications link, a first shift register for converting the serial data to parallel data, a second shift register for converting the parallel data back to serial data, and a second LED for transmitting that serial digital data out to a second digital device via a second high speed communications link.

BACKGROUND OF THE INVENTION

Parallel port connectors are known in the prior art. Parallel port connectors are commonly used to connect digital devices such as compact disc ("CD") or mini disc ("MD") players to a personal computer. Converters are also known in the prior art for converting the digital data stored on a personal computer to analog data which can then be stored on an analog storage device via conventional cable connections. The emergence of digitally recordable storage media such as recordable MDs requires that the digital data from a personal computer be converted to an analog signal, transported from the personal computer to an MD, and then reconverted from analog to digital within the MD player for recording. Such a double-conversion process seriously degrades the digital recording and quality.

The typical MD player has a serial digital fiber input called a TOS Link. It is known in the prior art to use a TOS Link to send a digital signal directly from a digital device such as a CD player to the digital fiber input of an MD player. The digital fiber input provides optimum digital recording with minimum sound degradation.

SUMMARY OF THE INVENTION

The present invention is directed to a parallel port to serial digital fiber link connector which converts an 8 bit parallel signal to a serial signal to record on a digital device such as a compact disc ("CD") or mini disc ("MD") player. The parallel port to digital serial fiber link connector of the present invention minimizes digital recording degradation caused by known methods for converting a digital signal (such as a digital signal stored on a personal computer) to an analog signal which is transferred over wire connections and then reconverted to a digital signal for use by the second digital device.

The present invention greatly improves both the quality and the portability of various digital recordings. By transferring a digital signal without the use of an intermediate analog step, the same digital recording can be easily uploaded to another personal computer via the parallel port connector of the present invention or played on a portable digital playback device.

A preferred embodiment of the present invention includes a parallel port connector, two shift registers, and two LEDs. The parallel port connector connects the present invention to the parallel port of a personal computer. A first shift register transmits digital data from either of the two LEDs to a personal computer through the parallel port. A second shift register transmits digital data from the parallel port of a personal computer to either of the two LEDs. A first serial fiber link connects a first digital device (such as a CD player) to the first LED. A second serial fiber link connects a second digital device (such as an MD player) to the second LED.

The personal computer utilizes the present invention to transfer both control data and production data to the first and second digital devices. The control data is the digital data that specifies the operation to be performed by the digital device. The production data is the digital data produced in response to the control data sent or the digitally manipulated data received from the personal computer. The production data is preferably stored on either the personal computer or the second digital device. The present invention allows the user to transmit digital data from the first digital device to the personal computer for storage, digital manipulation or transmission to a second digital device.

The present invention allows the user to record directly from a first digital device to a second digital device without the intermediate computer memory storage or the digital to analog double conversion. The present invention also uses only one parallel port to connect both digital devices to the personal computer to perform such digital recording. Such improvements make the benefits of digital recording more accessible to smaller computer platforms.

It is known to record directly from a first digital device to a second digital device using a serial fiber link. In the prior art, however, such a recording process involves no intermediate data manipulation. The present invention allows the user to digitally record digital data directly from a first digital device to a second digital device, record from a first digital device to a personal computer's memory, or record digital data stored in the personal computer's memory to a second digital device. The present invention also allows the user to manipulate the digital data using the personal computer before recording it on the second digital device.

The present invention minimizes recording degradation by eliminating the intervening digital-to-analog conversion and analog-to-digital conversion of prior art converters. Yet, the invention may be practicable without any modification to either a personal computer or to a digital device architecture. The second digital device is capable of storing digital data (such as an MD player) to allow the user to create personalized digital recordings of CDs. Therefore, the parallel port to serial digital fiber link connector allows consumers to enhance their recording ability with minimal cost.

DETAILED DESCRIPTION OF A PREFERRED EMBODIMENT

Figure 1:
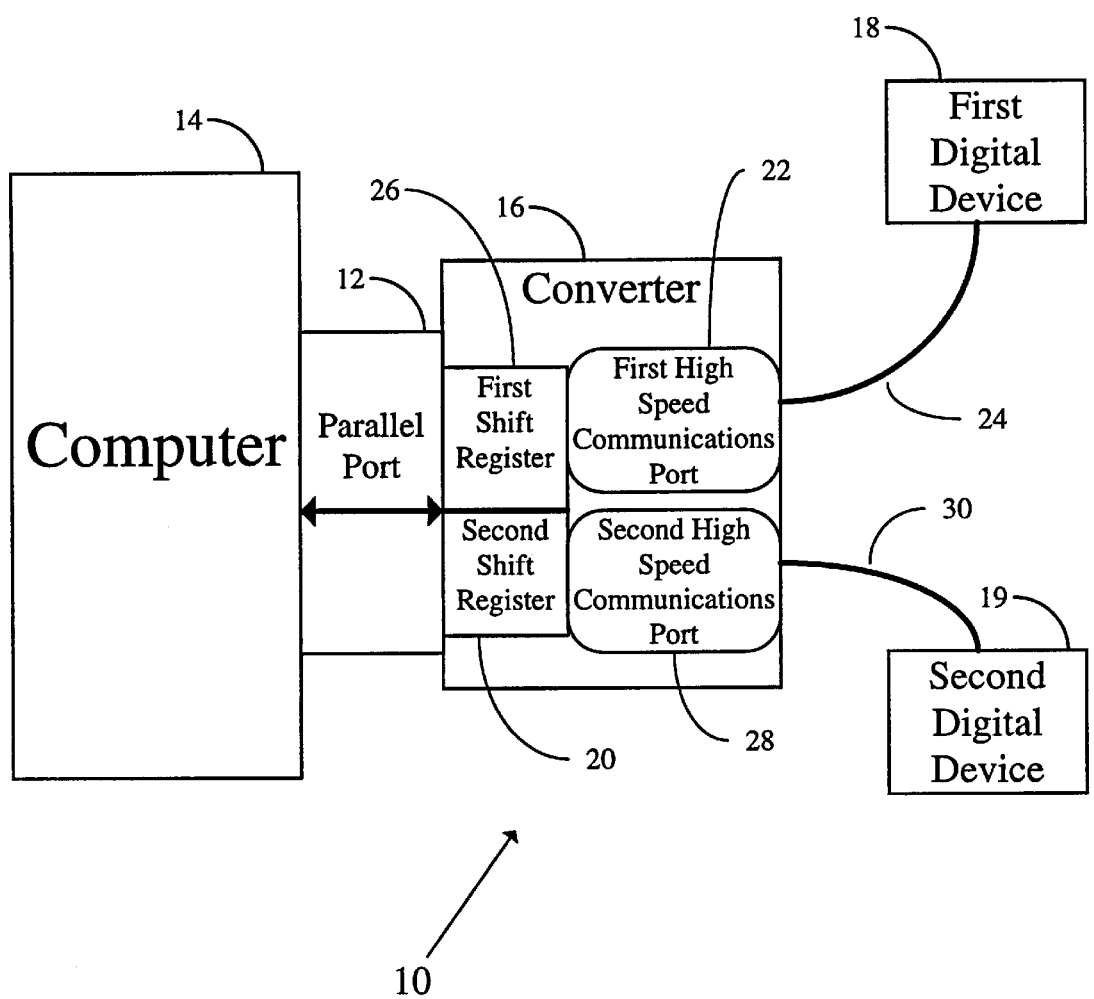
FIG. 1 is a generalized block diagram of a parallel port to serial digital fiber link connector system in accordance with the present invention.

FIG. 1 illustrates a generalized block diagram of a parallel port to serial digital fiber link connector system 10.

Parallel port 12 present on personal computer 14 connects a converter 16 to personal computer 14 and allows for digital data transmission. In turn converter 16 is connected to first digital device 18 and second digital device 19.

Personal computer 14 is capable of sending and receiving both control data and production data. The user can manually supply the control data that indicate the functions to be performed by first and second digital devices 18 and 19 by means of personal computer 14. The control data are then sent from personal computer 14 to the respective digital devices 18 and 19. Digital devices 18 and 19 transmit response data to personal computer 14 including device operation status indications such as: readiness, pause, malfunction or error, time remaining, and the like.

The user commands can be entered from a variety of interfaces including: a keyboard, mouse, light pen, voice-controlled interface, etc. It is preferable to use the interface that accompanies the computer for convenience to the consumer. It should be understood, however, that after market interfaces can be substituted by those skilled in the art of digital interfaces.

The production data comprises the output from digital devices 18 or 19 or personal computer 14 in response to the control data or user commands entered from personal computer 14. If first device is an audio compact disc ("CD") player, for example, then the production data will most likely be music. It should be understood, however, that the production data is not limited to music and other digital data may be recorded by those skilled in the art of digital recording.

To record digital data from first digital device 18 to personal computer's 14 memory, personal computer 14 sends control data, indicating its readiness to receive production data from first digital device 18, via parallel port 12 to second shift register 20. Second shift register 20, in turn, converts the (8 bit) control data to serial control data and sends the serial control data to first high speed communications port 22. First high speed communications port 22 converts the control data into a control signal recognizable by first high speed communications link 24.

First high speed communications port 22 sends the control signal via first high speed communications link 24 to first digital device 18.

First digital device 18 sends a production signal via first high speed communications link 24 to first high speed communications port 22. First high speed communications port 22 converts the production signal into production data recognizable by first shift register 26. In turn, first shift register 26 reads the production data from first high speed communications port 22 and transmits the production data via parallel port 12 to personal computer 14. In response to the user's initial command, personal computer 14 optionally stores the production data in its digital memory.

To record from personal computer 14 to second digital device 19, personal computer 14 sends control data, indicating its readiness to send production data, through converter 16 to second digital device 19. Second digital device 19 sends a response control signal, indicating its readiness to receive production data, by means of converter 16 to personal computer 14.

Personal computer 14 sends production data via converter 16 to second digital device 19. Upon the user's command, second digital device 19 records or plays the production data.

To record directly from first digital device 18 to second digital device 19 with digital manipulation performed by personal computer 14 on the production data before it is transferred to second digital device 19, personal computer 14 sends control data, indicating second digital device's 19 readiness to receive production data from first digital device 18 via converter 16. First digital device 18 sends a response control signal. Personal computer 14 sends control data, indicating first digital device's 18 readiness to transmit production data, via converter 16 to second digital device 19. Second digital device 19 sends a response control signal to personal computer 14 via converter 16.

First digital device 18 sends the production data via converter 16 to personal computer 14. Personal computer 14 digitally manipulates the production data according to the user's commands. Digital manipulation by personal computer 14 may involve: mixing the production data with previously stored production data, performing sound modifications on the production data, and the like.

The intermediate step of storing the production data in personal computer's 14 memory is bypassed. Personal computer 14 sends the manipulated production data to second digital device 19 via converter 16. Upon user's command, second digital device 19 records the production signal or plays the production data.

Alternatively, the user may record directly from first digital device 18 to second digital device 19 without intermediate manipulation or storage by personal computer 14. In this alternative, personal computer 14 sends control data, indicating second digital device's 19 readiness to receive production data, via converter 16 to first digital device 18. First digital device 18 sends response control data via converter 16 to personal computer 14. Personal computer 14 sends control data to second digital device 19, indicating first digital device's 18 readiness to transmit production data to first digital device 19, via converter 16. Second digital device 19 sends response control data, indicating its readiness to receive production data from first digital device 18.

First digital device 18 sends a production signal via first high speed communications link 24 to first high speed communications port 22. First high speed communications port 22 converts the production signal into production data recognizable by first shift register 26. In turn, first shift register 26 reads the production data from first high speed communications port 22. The production data is transferred directly from the first shift register 26 to the second shift register 20, bypassing parallel port 12.

Second shift register 20, in turn, converts the (8 bit) production data to serial production data and sends the serial production data to second high speed communications port 28. Second high speed communications port 28 converts the serial production data into a production signal recognizable by second high speed communications link 30. Second high speed communications port 28 sends the production signal via second high speed communications link 30 to second digital device 19. Upon user's command, second digital device 19 records or plays the production data.

It is preferred that the digital recording control device be a personal computer 14. It should be understood, however, that other control devices that have parallel ports may be substituted by those skilled in the art.

It is preferred that the first and second high speed communications links 24 and 32 be serial digital fiber links such as TOS Links®. However, infrared transmitters, as well as other light transferring devices may be substituted by those skilled in the art of digital communications. It is likewise preferred that the first and second high speed communications ports 22 and 30 be light emitting diodes capable of communicating with the serial digital fiber links. However, those skilled in the art of digital communications may be able to substitute other devices for transferring and receiving light pulses.

In many cases the first digital device 18 will be a CD player. It should be understood, however, that other digital playback devices such as MiniDisc players, digital audio tape players, etc. may be substituted by those skilled in the art of digital audio devices. It is also preferred that the second digital device 19 be a MiniDisc recorder/player. It should be understood, however, that other digital recording devices such as a digital audio tape recorder/player ("DAT") could also be used by a person skilled in the art of digital recording.

Preferred embodiments of the present invention have been disclosed. A person of ordinary skill in the art would realize, however, that certain modifications would come within the teachings of this invention. Therefore, the following claims should be studied to determine the true scope and content of the invention.

What is claimed:

1. A converter, comprising:
   a parallel port connected to a computer for transmitting digital data between said converter and the computer;
   at least one high speed communications port connected to a digital device for transmitting said digital data between said converter and the digital device; and
   at least one shift register connected to said parallel port for transmitting said digital data between said parallel port and said high speed communications port; and
   a second shift register connected between a second high speed communications port and said parallel port.

2. A converter, comprising:
   a parallel port connected to a computer for transmitting digital data between said converter and the computer;
   at least one high speed communications port connected to a digital device for transmitting said digital data between said converter and the digital device; and
   at least one shift register connected to said parallel port for transmitting said digital data between said parallel port and said high speed communications port;
   wherein said high speed communications port is capable of sending and receiving said digital data by way of light pulses.

3. A converter, comprising:
   a parallel port connected to a computer for transmitting digital data between said converter and the computer;
   at least one high speed communications port connected to a digital device for transmitting said digital data between said converter and the digital device; and
   at least one shift register connected to said parallel port for transmitting said digital data between said parallel port and said high speed communications port;
   wherein there are at least two shift registers.

4. The converter of claim 3, wherein a first shift register receives said digital data from a first high speed communications port and transmits said digital data to said parallel port.

5. The converter of claim 4, wherein a second shift register receives said digital data from said parallel port and transmits said digital data to said first high speed communications port.

6. The converter of claim 3, wherein a first shift register receives said digital data from a first high speed communications port and transmits said digital data to said parallel port, and a second shift register receives said digital data from said parallel port and transmits said digital data to a second high speed communications port.

7. The converter of claim 6, wherein each of said shift registers is connected to each of said high speed communication ports.

8. The converter of claim 7, wherein said digital data comprises control data and production data, said control data being transmitted between said parallel port and said high speed communications ports.

9. The converter of claim 3, wherein there are at least two high speed communications ports and said production data is transmitted between said first and second high speed communications ports and bypasses said parallel port.

10. A converter system comprising:
    a converter for transmitting digital data;
    a computer for receiving, storing and transmitting said digital data;
    at least two high speed communications links for transmitting said digital data;
    at least two digital devices;
    said converter in communication with said computer for transmitting said digital data from said digital device to said computer, and including
      a parallel port connected to said computer for transmitting said digital data between said converter and said computer,
      at least two high speed communications ports, each connected to one of said digital devices for transmitting said digital data between said converter and said digital device, and
      at least two shift registers, each connected to said parallel port and also connected to one of said high speed communication ports, for transmitting said digital data between said parallel port and said high speed communications port;
    said computer in communication with said converter for receiving said digital data received from said digital device;
    said high speed communications links in communication with said high speed communications ports for transmitting said digital data from said high speed communications port to said digital device; and
    said digital devices in communication with said high speed communications links for transmitting said digital data to and receiving said digital data from said converter.

11. A converter system comprising:
    a converter for transmitting digital data;
    a computer for receiving, storing and transmitting said digital data;
    at least one high speed communications link for transmitting said digital data;
    at least one digital device;
    said converter in communication with said computer for transmitting said digital data from said digital device to said computer, and including
      a parallel port connected to said computer for transmitting said digital data between said converter and said computer,
      at least one high speed communications port connected to said digital device for transmitting said digital data between said converter and said digital device, and
      at least one shift register connected to said parallel port for transmitting said digital data between said parallel port and said high speed communications port;
    said computer in communication with said converter for receiving said digital data received from said digital device;
    said high speed communications link in communication with said high speed communications port for transmitting said digital data from said high speed communications port to said digital device; and
    said digital device in communication with said high speed communications link for transmitting said digital data to and receiving said digital data from said converter;

wherein said digital device transmits said digital data through said converter to said computer for storage or manipulation.

12. A converter system comprising:
a converter for transmitting digital data;
a computer for receiving, storing and transmitting said digital data;
at least one high speed communications link for transmitting said digital data;
at least one digital device;
said converter in communication with said computer for transmitting said digital data from said digital device to said computer, and including
  a parallel port connected to said computer for transmitting said digital data between said converter and said computer,
  at least one high speed communications port connected to said digital device for transmitting said digital data between said converter and said digital device, and
  at least one shift register connected to said parallel port for transmitting said digital data between said parallel port and said high speed communications port;
said computer in communication with said converter for receiving said digital data received from said digital device;
said high speed communications link in communication with said high speed communications port for transmitting said digital data from said high speed communications port to said digital device; and
said digital device in communication with said high speed communications link for transmitting said digital data to and receiving said digital data from said converter;
wherein said computer transmits digital data through said converter to said digital device for storage.

13. A converter system comprising:
a converter for transmitting digital data;
a computer for receiving, storing and transmitting said digital data;
at least one high speed communications link for transmitting said digital data;
at least one digital device;
said converter in communication with said computer for transmitting said digital data from said digital device to said computer, and including
  a parallel port connected to said computer for transmitting said digital data between said converter and said computer,
  at least one high speed communications port connected to said digital device for transmitting said digital data between said converter and said digital device, and
  at least one shift register connected to said parallel port for transmitting said digital data between said parallel port and said high speed communications port;
said computer in communication with said converter for receiving said digital data received from said digital device;
said high speed communications link in communication with said high speed communications port for transmitting said digital data from said high speed communications port to said digital device; and
said digital device in communication with said high speed communications link for transmitting said digital data to and receiving said digital data from said converter;
wherein said digital device transmits digital data through said converter to at least one other digital device for storage.

14. A converter system comprising:
a converter for transmitting digital data;
a computer for receiving, storing and transmitting said digital data;
at least one high speed communications link for transmitting said digital data;
at least one digital device;
said converter in communication with said computer for transmitting said digital data from said digital device to said computer, and including
  a parallel port connected to said computer for transmitting said digital data between said converter and said computer,
  at least one high speed communications port connected to said digital device for transmitting said digital data between said converter and said digital device, and
  at least one shift register connected to said parallel port for transmitting said digital data between said parallel port and said high speed communications port;
said computer in communication with said converter for receiving said digital data received from said digital device;
said high speed communications link in communication with said high speed communications port for transmitting said digital data from said high speed communications port to said digital device; and
said digital device in communication with said high speed communications link for transmitting said digital data to and receiving said digital data from said converter;
wherein said high speed communications link is an optical transmission link.

15. The converter system of claim 14, wherein said optical transmissions link is a TOS LINK.

16. A method for storing and recording data comprising the steps of:
generating a signal from at least one digital device indicating a digital value;
transmitting said signal through at least one of a plurality of high speed communications links to at least one of a plurality of high speed communications ports, wherein each port is connected to a different shift register of a plurality of shift registers;
converting said signal into said digital value;
transmitting said digital value from one of said high speed communications ports to a corresponding shift register;
transmitting said digital value from said shift register to a parallel port of a computer; and
retrieving said digital value from said parallel port.

17. A method for storing and recording data comprising the steps of:
generating a signal from at least one digital device indicating a digital value;
transmitting said signal through at least one high speed communications link to at least one high speed communications port;
converting said signal into said digital value;
transmitting said digital value from said high speed communications port to at least one shift register;
transmitting said digital value from said at least one shift register to a parallel port of a computer; and
retrieving said digital value from said parallel port; and
storing said digital value in digital memory.

18. A method for storing and recording data comprising the steps of:

generating a signal from at least one digital device indicating a digital value;

transmitting said signal through at least one high speed communications link to at least one high speed communications port;

converting said signal into said digital value;

transmitting said digital value from said high speed communications port to at least one shift register;

transmitting said digital value from said at least one shift register to a parallel port of a computer; and retrieving said digital value from said parallel port;

digitally manipulating a first digital value into a second digital value;

transmitting said second digital value from said digital memory to said parallel port;

transmitting said second digital value from said parallel port to a second shift register;

transmitting said second digital value from said second shift register to a second high speed communications port;

converting said second digital value into a second signal recognizable by a second high speed communications link; and transmitting said second signal from said second high speed communications port to a second digital device through said second high speed communications link.

19. The method for storing and recording data of claim 17, further including the steps of:

accepting a desired operation to be performed by said digital device;

generating control data in said digital memory indicating said desired operation;

transmitting said control data from said digital memory to said parallel port;

transmitting said control data from said parallel port to a second shift register;

transmitting said control data from said second shift register to one of said high speed communications ports;

converting said control data into a control signal recognizable by one of said high speed communications links;

transmitting said control signal from one of said high speed communications ports to one of said digital devices through one of said high speed communications links;

performing said operation indicated by said control signal; and sending a response signal to said digital memory indicating said digital device's status.

20. A method for storing and recording data comprising the steps of:

generating a signal from at least one digital device indicating a digital value;

transmitting said signal through at least one high speed communications link to at least one high speed communications port;

converting said signal into said digital value;

transmitting said digital value from said high speed communications port to at least one shift register;

transmitting said digital value from said at least one shift register to a parallel port of a computer; and retrieving said digital value from said parallel port;

generating a signal from at least one digital device indicating a digital value;

transmitting said signal through at least one high speed communications link to at least one high speed communications port;

converting said signal into said digital value;

transmitting said digital value from said high speed communications port to at least one shift register;

transmitting said digital value from said shift register to a second shift register;

transmitting said second digital value from said second shift register to a second high speed communications port;

converting said second digital value into a second signal recognizable by a second high speed communications link; and transmitting said second signal from said second high speed communications port to a second digital device through said second high speed communications link.

* * * * *